United States Patent
Briar et al.

(10) Patent No.: US 6,750,082 B2
(45) Date of Patent: Jun. 15, 2004

(54) METHOD OF ASSEMBLING A PACKAGE WITH AN EXPOSED DIE BACKSIDE WITH AND WITHOUT A HEATSINK FOR FLIP-CHIP

(75) Inventors: John Briar, Singapore (SG); Roman Perez, Singapore (SG); Tan Kim Hwee, Singapore (SG)

(73) Assignee: Advanpack Solutions Pte. Ltd., Singapore (SG)

( * ) Notice: Subject to any disclaimer, the term of this patent is extended or adjusted under 35 U.S.C. 154(b) by 0 days.

(21) Appl. No.: 10/243,437

(22) Filed: Sep. 13, 2002

(65) Prior Publication Data

US 2004/0053445 A1 Mar. 18, 2004

(51) Int. Cl.⁷ .............................................. H01L 21/44
(52) U.S. Cl. ..................... 438/108; 438/117; 438/122; 438/124; 438/126; 438/127
(58) Field of Search ................ 438/107, 108, 438/112, 117, 121–127, 759, 977

(56) References Cited

U.S. PATENT DOCUMENTS

| | | | |
|---|---|---|---|
| 4,615,857 A | 10/1986 | Baird | 264/272.17 |
| 5,155,068 A * | 10/1992 | Tada | 438/125 |
| 5,891,377 A | 4/1999 | Libres et al. | 264/272.14 |
| 5,949,132 A | 9/1999 | Libres et al. | 257/666 |
| 6,117,797 A * | 9/2000 | Hembree | 438/759 |
| 6,184,062 B1 * | 2/2001 | Brofman et al. | 438/106 |
| 6,188,127 B1 * | 2/2001 | Senba et al. | 257/686 |
| 6,309,916 B1 | 10/2001 | Crowley et al. | 438/127 |
| 6,548,330 B1 * | 4/2003 | Murayama et al. | 438/127 |

FOREIGN PATENT DOCUMENTS

JP 2001-144218 A * 5/2003

OTHER PUBLICATIONS

Wolf et al, "Silicon Processing for the VLSI Era, vol. 2—Process Integration", 1990, Lattice Press, pp. 66–67.*

* cited by examiner

Primary Examiner—Kevin M. Picardat
(74) Attorney, Agent, or Firm—George O. Saile; Stephen B. Ackerman; Stephen G. Stanton

(57) ABSTRACT

A method of assembling a package having an exposed die comprising the following steps. A die attached to a substrate by connectors is provided. The die having a backside. Encapsulate is formed around the die and over the backside of the die to form an encapsulated package. The encapsulate overlying the backside of the die and a portion of the backside of the die are removed using a backside exposure process to complete the assembled package having the die exposed.

58 Claims, 1 Drawing Sheet

METHOD OF ASSEMBLING A PACKAGE WITH AN EXPOSED DIE BACKSIDE WITH AND WITHOUT A HEATSINK FOR FLIP-CHIP

FIELD OF THE INVENTION

The present invention relates generally to fabrication of semiconductor devices, and more specifically to packaging integrated circuits.

BACKGROUND OF THE INVENTION

Packaged integrated circuit (IC) having plastic, epoxy or resin packages encapsulating the die (semiconductor chip) and a portion of the lead frame and leads are produced using a variety of methods.

U.S. Pat. No. 5,891,377 to Libres et al. describes lead frames, mold chases and mold flashes in a dambarless leadframe process.

U.S. Pat. No. 4,615,857 to Baird describes an encapsulating method for reducing flash.

U.S. Pat. No. 6,309,916 B1 to Crowley et al. describes a method of molding a plastic body of a semiconductor package.

U.S. Pat. No. 5,949,132 to Libres et al. describes a method and apparatus for encapsulating an integrated circuit die and leadframe assembly using dambarless leadframes.

SUMMARY OF THE INVENTION

Accordingly, it is an object of the present invention to provide a improved method of assembling an integrated circuit package with an exposed die back.

Other objects will appear hereinafter.

It has now been discovered that the above and other objects of the present invention may be accomplished in the following manner. Specifically, a die attached to a substrate by connectors is provided. The die having a backside. Encapsulate is formed around the die and over the backside of the die to form an encapsulated package. The encapsulate overlying the backside of the die and a portion of the backside of the die are removed using a backside exposure process to complete the assembled package having the die exposed.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Initial Structure

Figure 1:
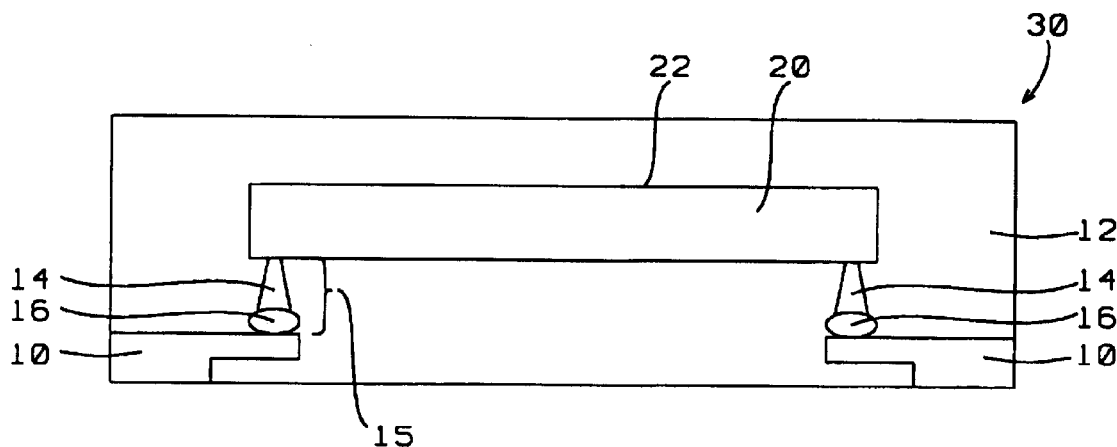
FIGS. 1 and 2 schematically illustrate in cross-sectional representation a preferred embodiment of the present invention and illustrating non-collapsible copper pillars and optional solders.

As shown in FIG. 1, a encapsulated package 30 includes a die 20 having a backside 22 and attached to a substrate 10 by connectors 15. Encapsulate 12 surrounds the die 20.

Die 20 is preferably a wafer comprised of silicon (Si), germanium (Ge), a semiconductor chip or silicon-on-insulator (SOI) and is more preferably a semiconductor chip, such as a flip-chip, comprised of silicon.

Substrate 10 may be a leadframe, preferably such as a metal leadframe, flex, PCB, tape, or a laminate substrate.

Connectors 15 may comprise, for example, pillars 14, or pillars 14 and underlying solders 16. Pillars are preferably comprised of a conductive metal such as copper and are more preferably copper. Solders 16 are preferably comprised of a tin composition such as a tin/lead composition or a lead-free solder material.

In one option of the preferred embodiment, connectors 15 comprise non-collapsible pillars 14 with underlying solders 16. Non-collapsible pillars, as the name implies, do not collapse or are not compressed during fabrication and processing of the encapsulated package 30 so that the minimum thickness of the connectors 15 are known and constant during the processing of the present invention which allows for a much tighter tolerance and thus a smaller backside exposure process 24 removal tolerance is achievable as the thickness of the die 20 and substrate 10 are precisely known.

U.S. patent application Ser. No. 09/564,382, filed Apr. 27, 2000, entitled "Improved Pillar Connections For Semiconductor Chips And Method of Manufacture" describes formation of a non-collapsible pillar and is incorporated by reference herein.

Encapsulate 12 is preferably comprised of a mold compound or an epoxy material and is more preferably a mold compound.

Exposing the Backside 22 of Die 20

Figure 2:
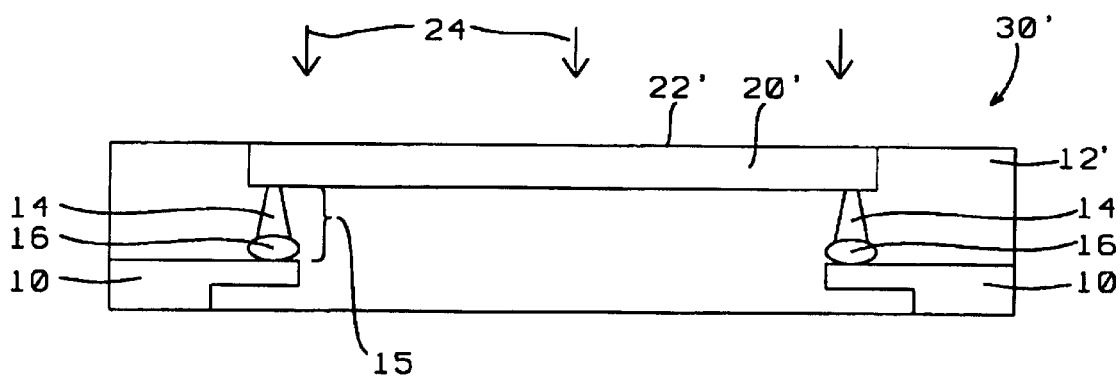

As shown in FIG. 2, the backside 22 of die 20 is exposed using backside exposure process 24 that also removes at least the portion of the encapsulate 12 overlying die 20 and provides for a fine polished surface 22' (Ra) to improve the reliability by reducing die cracking. Backside exposure process 24 is preferably a mechanical backside exposure process, a chemical backside exposure etching process, a laser backside exposure etching process or a plasma backside exposure etching process. Regardless of which specific backside exposure process 24 is used, it exposes a generally thinned die 20' backside 22'.

The mechanical backside exposure process 24 preferably uses mechanical grinding of the encapsulated package 30 overlying the backside 22 of the die 20 to at least expose the backside 22 of the die 20 and preferably also removing a portion of the die 20 to form a thinner encapsulated package 30' having a thinner die 20'. The mechanical grinding backside exposure process 24 preferably uses a grinding machine for polishing of the parts with different grades of sandpaper. When the desired thickness is approached, a fine grade of sandpaper is used to give a fine polished surface 22' of the bottom die 20'.

If a chemical backside exposure etching process 24 is used, it is preferably a chemical that will etch/react with the mold compound and silicon chip and will remove the mold compound at about the same rate as the silicon ship.

If a laser backside exposure etching process 24 is used, it is preferably employs a short wavelength laser, e.g. a green laser, that will not damage the electrical properties of the chip.

If a plasma backside exposure etching process 24 is used, it is preferably employs a bombardment and etch-type process.

The backside exposure process 24 continues until the die 20/package 30 achieves the desired thickness.

Regardless of which specific backside exposure process 24 is used, the rate of removal of the encapsulate 12 and the rate of removal of the die 20 are about the same and the desired thickness of the thinned package 30' is preferably from about 0.3 to 0.7 mm and more preferably from about 0.5 to 0.7 mm that includes a substrate 10 thickness of preferably from about 0.13 to 0.20 mm, a connector 15 thickness of preferably about 0.10 mm, a die 20 thickness of from about 0.10 to 0.3 mm and more preferably from about 0.15 to 0.2 mm.

In any event, the thinned die 20' is thinned to not less than about 0.10 mm.

The exposure of the thinned backside 22' of the thinned die 20' provides better thermal performance.

Figure 3:
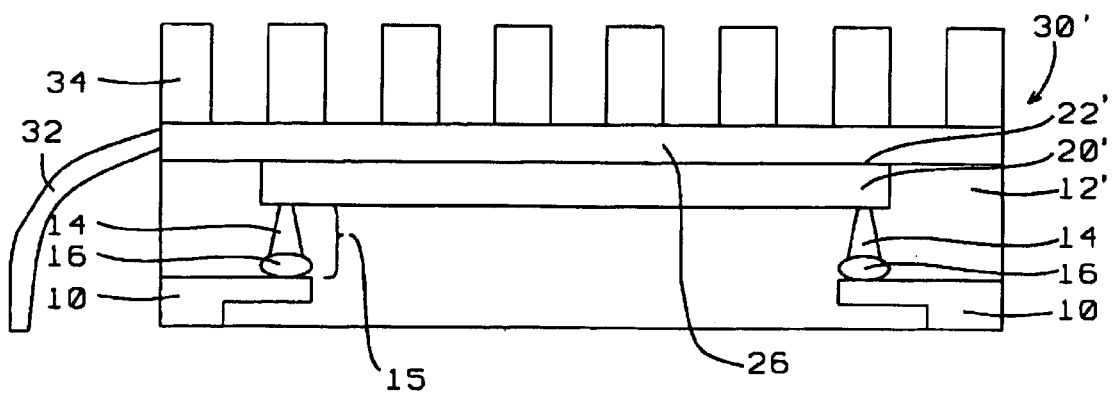
FIG. 3 schematically illustrates in cross-sectional representation an alternate embodiment of the present invention and illustrating non-collapsible pillars and optional solders.

Use of Heatsink 26—FIG. 3

As shown in FIG. 3, in an alternate embodiment, a heatsink 26 may then be affixed to the thinned exposed backside 22' of the thinned die 20' to provide for even better heat dissipation performance. Heatsink may include optional fins 34 as shown in FIG. 3.

Heatsink 26 is preferably comprised of a good conductive heat material. Heatsink 26 can be grounded if necessary, depending upon the electrical design of the chip, along with the die to provide electrical grounding of the die. Heatsink 26 may be grounded using a ground bond or a ground bond cable (both represented as at 32 in FIG. 3) bonded to the heatsink 26 (as shown in FIG. 3) or to the optional fins 34, if used.

ADVANTAGES OF THE INVENTION

The advantages of one or more embodiments of the present invention include:

1) it is not necessary to back grind the wafer as thinning of the wafer can be done in the same processes;
2) there is not need to have a tailor-made mold chase to form the encapsulate over the die so as to expose the die backside;
3) no extra processes or materials (such as tape) are required to expose the die backside;
4) there are no remaining mold flashes or bleed on the exposed top of the die that must be removed as the backside exposure process also removes any mold flashes or bleed;
5) the package reliability is improved;
6) a thinner package may be achieved;
7) better thermal performance is achieved;
8) die cracking is reduced; and
9) electrical grounding of the die is possible.

While particular embodiments of the present invention have been illustrated and described, it is not intended to limit the invention, except as defined by the following claims.

We claim:

1. A method of assembling a package having an exposed die, comprising the steps of:
   providing a die attached to a substrate by connectors; the die having a backside; the entire die being above the substrate;
   forming encapsulate around the die and over the backside of the die to form an encapsulated package; and
   removing the encapsulate overlying the backside of the die and a portion of the backside of the die using a backside exposure process to complete the assembled package having the die exposed.

2. The method of claim 1, including the step of affixing a heatsink to the exposed die of the assembled package.

3. The method of claim 1, including the step of affixing a heatsink to the exposed die of the assembled package; the heatsink including fins.

4. The method of claim 1, wherein the encapsulate overlying the backside of the die is removed at a first rate and the portion of the backside of the die is removed at a second rate, wherein the first and second rates are substantially equal.

5. The method of claim 1, wherein the die is a wafer comprised of Si or Ge, a semiconductor chip or silicon-on-insulator.

6. The method of claim 1, wherein the die is a wafer comprised of silicon.

7. The method of claim 1, wherein the die is a silicon-on-insulator wafer.

8. The method of claim 1, wherein the die is a semiconductor chip.

9. The method of claim 1, wherein the substrate is a leadframe or a laminate substrate.

10. The method of claim 1, wherein the substrate is a leadframe selected from the group consisting of a metal leadframe, flex, PCB and tape.

11. The method of claim 1, wherein the substrate is a laminate substrate.

12. The method of claim 1, wherein the connectors are pillars.

13. The method of claim 1, wherein the connectors are pillars comprised of a conductive metal.

14. The method of claim 1, wherein the connectors are pillars comprised of copper.

15. The method of claim 1, wherein the connectors are comprised of non-collapsible pillars and respective underlying solders; wherein the solders are comprised of a tin composition or a lead-free composition.

16. The method of claim 1, wherein the connectors are comprised of non-collapsible pillars and respective underlying solders; wherein the solders are comprised of a tin/lead composition or a lead-free composition.

17. The method of claim 1, wherein the encapsulate is comprised of a mold compound or an epoxy material.

18. The method of claim 1, wherein the encapsulate is comprised of a mold compound.

19. The method of claim 1, wherein the backside exposure process is a process selected from the group consisting of a mechanical backside exposure process, a chemical backside exposure etching process, a laser backside exposure etching process and a plasma backside exposure etching process.

20. The method of claim 1, wherein the backside exposure process is a mechanical grinding backside exposure process.

21. The method of claim 1, including the step of grounding the die.

22. A method of assembling a package having an exposed die, comprising the steps of:
   providing a die attached to a substrate by connectors; the die having a backside; wherein the connectors are comprised of non-collapsible pillars and respective underlying solders; the entire die being above the substrate;
   forming encapsulate around the die and over the backside of the die to form an encapsulated package; and
   removing the encapsulate overlying the backside of the die and a portion of the backside of the die using a backside exposure process to complete the assembled package having the die exposed.

23. The method of claim 22, including the step of affixing a heatsink to the exposed die of the assembled package.

24. The method of claim 22, including the step of affixing a heatsink to the exposed die of the assembled package; the heatsink including fins.

25. The method of claim 22, wherein the encapsulate overlying the backside of the die is removed at a first rate and the portion of the backside of the die is removed at a second rate, wherein the first and second rates are substantially equal.

26. The method of claim 22, wherein the die is a wafer comprised of Si or Ge, a semiconductor chip or silicon-on-insulator.

27. The method of claim 22, wherein the die is a wafer comprised of silicon.

28. The method of claim 22, wherein the die is a silicon-on-insulator wafer.

29. The method of claim 22, wherein the die is a semiconductor chip.

30. The method of claim 22, wherein the substrate is a leadframe or a laminate substrate.

31. The method of claim 22, wherein the substrate is a leadframe selected from the group consisting of a metal leadframe, flex, PCB and tape.

32. The method of claim 22, wherein the substrate is a laminate substrate.

33. The method of claim 22, wherein the underlying solders are comprised of a tin composition or a lead-free composition.

34. The method of claim 22, wherein the underlying solders are comprised of a tin/lead composition or a lead-free composition.

35. The method of claim 22, wherein the encapsulate is comprised of a mold compound or an epoxy material.

36. The method of claim 22, wherein the encapsulate is comprised of a mold compound.

37. The method of claim 22, wherein the backside exposure process is a process selected from the group consisting of a mechanical backside exposure process, a chemical backside exposure etching process, a laser backside exposure etching process and a plasma backside exposure etching process.

38. The method of claim 22, wherein the backside exposure process is a mechanical grinding backside exposure process.

39. The method of claim 22, including the step of grounding the die.

40. A method of assembling a package having an exposed die, comprising the steps of:
providing a die attached to a substrate by connectors; the die having a backside; wherein the die is a wafer comprised of Si or Ge, a semiconductor chip or silicon-on-insulator; wherein the substrate is a leadframe or a laminate substrate; the entire die being above the substrate;
forming encapsulate around the die and over the backside of the die to form an encapsulated package; and
removing the encapsulate overlying the backside of the die and a portion of the backside of the die using a backside exposure process to complete the assembled package having the die exposed.

41. The method of claim 40, including the step of affixing a heatsink to the exposed die of the assembled package.

42. The method of claim 40, including the step of affixing a heatsink to the exposed die of the assembled package; the heatsink including fins.

43. The method of claim 40, wherein the encapsulate overlying the backside of the die is removed at a first rate and the portion of the backside of the die is removed at a second rate, wherein the first and second rates are substantially equal.

44. The method of claim 40, wherein the die is a wafer comprised of silicon.

45. The method of claim 40, wherein the die is a silicon-on-insulator wafer.

46. The method of claim 40, wherein the die is a semiconductor chip.

47. The method of claim 40, wherein the substrate is a leadframe selected from the group consisting of a metal leadframe, flex, PCB and tape.

48. The method of claim 40, wherein the connectors are pillars.

49. The method of claim 40, wherein the connectors are pillars comprised of a conductive metal.

50. The method of claim 40, wherein the connectors are pillars comprised of copper.

51. The method of claim 40, wherein the connectors are comprised of non-collapsible pillars and respective underlying solders.

52. The method of claim 40, wherein the connectors are comprised of non-collapsible pillars and respective underlying solders; wherein the solders are comprised of a tin composition or a lead-free composition.

53. The method of claim 40, wherein the connectors are comprised of non-collapsible pillars and respective underlying solders; wherein the solders are comprised of a tin/lead composition or a lead-free composition.

54. The method of claim 40, wherein the encapsulate is comprised of a mold compound or an epoxy material.

55. The method of claim 40, wherein the encapsulate is comprised of a mold compound.

56. The method of claim 40, wherein the backside exposure process is a process selected from the group consisting of a mechanical backside exposure process, a chemical backside exposure etching process, a laser backside exposure etching process and a plasma backside exposure etching process.

57. The method of claim 40, wherein the backside exposure process is a mechanical grinding backside exposure process.

58. The method of claim 40, including the step of grounding the die.

* * * * *